US008638590B2

(12) United States Patent
Hao et al.

(10) Patent No.: US 8,638,590 B2
(45) Date of Patent: Jan. 28, 2014

(54) RESISTANCE BASED MEMORY HAVING TWO-DIODE ACCESS DEVICE

(75) Inventors: Wuyang Hao, San Diego, CA (US); Jungwon Suh, San Diego, CA (US); Kangho Lee, San Diego, CA (US); Tae Hyun Kim, San Diego, CA (US); Jung Pill Kim, San Diego, CA (US); Seung H. Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 623 days.

(21) Appl. No.: 12/892,237

(22) Filed: Sep. 28, 2010

(65) Prior Publication Data

US 2012/0075906 A1    Mar. 29, 2012

(51) Int. Cl.
*G11C 11/00* (2006.01)
(52) U.S. Cl.
USPC ........... 365/148; 365/158; 365/171; 365/173; 365/175; 365/163
(58) Field of Classification Search
USPC ................ 365/158, 171, 173, 148, 175, 163
See application file for complete search history.

(56) References Cited

U.S. PATENT DOCUMENTS

| 5,793,697 | A | 8/1998 | Scheuerlein |
| 6,937,528 | B2* | 8/2005 | Hush et al. ............... 365/189.07 |
| 7,035,141 | B1 | 4/2006 | Tripsas et al. |
| 7,289,349 | B2 | 10/2007 | Campbell et al. |
| 7,701,745 | B2 | 4/2010 | Joo et al. |
| 2009/0180310 | A1* | 7/2009 | Shimomura et al. .......... 365/148 |
| 2009/0262572 | A1* | 10/2009 | Krusin-Elbaum et al. .... 365/163 |
| 2010/0097852 | A1 | 4/2010 | Chen et al. |
| 2010/0118602 | A1 | 5/2010 | Carter et al. |
| 2010/0142254 | A1* | 6/2010 | Choi et al. .................... 365/148 |

OTHER PUBLICATIONS

International Search Report and Written Opinion—PCT/US2011/053569—ISA/EPO—Nov. 30, 2011.

* cited by examiner

*Primary Examiner* — Vu Le
*Assistant Examiner* — Han Yang
(74) *Attorney, Agent, or Firm* — Sam Talpalatsky; Nicholas J. Pauley; Joseph Agusta

(57) ABSTRACT

A resistance-based memory has a two-diode access device. In a particular embodiment, a method includes biasing a bit line and a sense line to generate a current through a resistance-based memory element via a first diode or a second diode. A cathode of the first diode is coupled to the bit line and an anode of the second diode is coupled to the sense line.

14 Claims, 7 Drawing Sheets

RESISTANCE BASED MEMORY HAVING TWO-DIODE ACCESS DEVICE

I. FIELD

The present disclosure is generally related to resistance-based memories.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and Internet Protocol (IP) telephones, can communicate voice and data packets over wireless networks. Many such wireless telephones incorporate additional devices to provide enhanced functionality for end users. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

Computing devices may include memory, such as magneto-resistive random access memory (MRAM) arrays. To operate an MRAM array, it is generally necessary to differentiate between selected and non-selected memory cells within the array. An access device may correspond to each memory cell of the array and allow control of each memory cell. Each access device supplies sufficient current to read or write data from the corresponding memory cell. However, to supply such current to the corresponding memory cell, the access device may be large and may consume power.

III. SUMMARY

A resistance-based memory includes a two-diode access device. The two-diode access device may facilitate bidirectional current through selected memory cells while reducing leakage currents from unselected memory cells. The two-diode access device may be designed based on properties of a resistance-based memory element within a memory cell of the resistance-based memory. An example of a resistance-based memory element is a magnetic tunnel junction (MTJ). The two-diode access device may be chosen based on a programming voltage associated with the MTJ, first and second critical switching currents associated with the MTJ, or any combination thereof.

In a particular embodiment, a memory device includes a memory cell that includes at least one resistance-based memory element, a first diode coupled to the resistance-based memory element, and a second diode coupled to the resistance-based memory element. A current through the resistance-based memory element flows through either the first diode or the second diode. A cathode of the first diode is coupled to a bit line of the memory cell, and an anode of the second diode is coupled to a sense line of the memory cell.

In another particular embodiment, an apparatus includes a memory cell. The memory cell includes a word line, a bit line, a sense line, and a resistance-based memory element. The apparatus further includes means for accepting a current from the word line through the resistance-based memory element. The apparatus also includes means for accepting a current from the sense line through the resistance-based memory element and for opposing the current from the word line through the resistance-based memory element.

In another particular embodiment, a method includes biasing a bit line and a sense line to generate a current through a resistance-based memory element via a first diode or a second diode. A cathode of the first diode is coupled to the bit line, and an anode of the second diode is coupled to the sense line.

In another particular embodiment, a computer readable tangible medium storing instructions executable by a computer is provided. The instructions are executable by the computer to bias a bit line and a sense line to generate a current through a resistance-based memory element through a first diode or a second diode. A cathode of the first diode is coupled to the bit line, and an anode of the second diode is coupled to the sense line.

One particular advantage provided by at least one of the disclosed embodiments is reduced leakage current associated with unselected memory cells of a memory array. Another particular advantage provided by at least one of the disclosed embodiments includes low voltage dissipation by access devices of selected memory cells of a memory array. Still another particular advantage provided by at least one of the disclosed embodiments is enhanced switching current of selected memory cells in relation to access device size.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
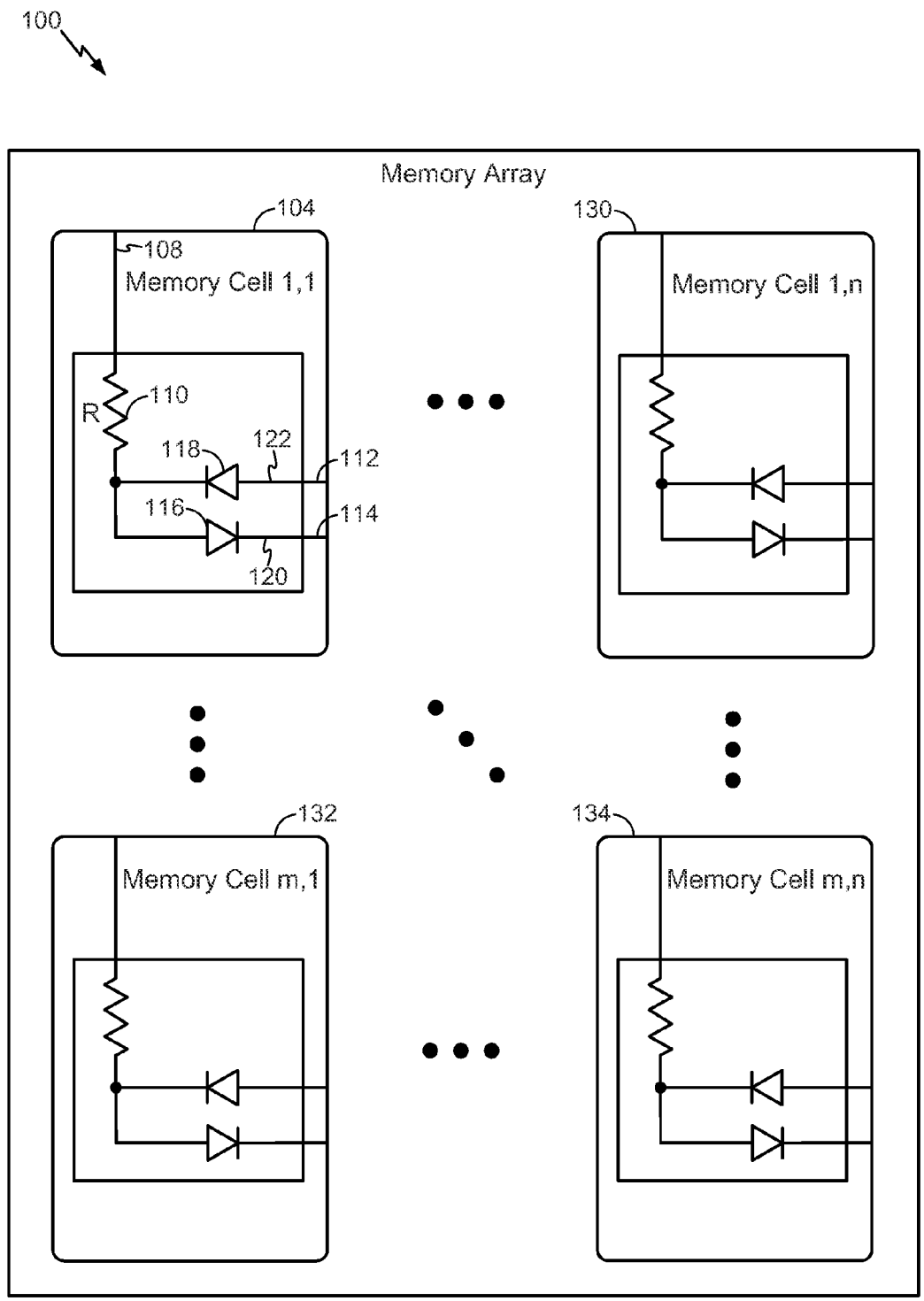
FIG. 1 is a diagram of a particular illustrative embodiment of a memory array including a resistance-based memory having a two-diode access device.

Referring to FIG. 1, a particular illustrative embodiment of a memory array including a resistance-based memory having a two-diode access device is disclosed and generally designated 100. Generally, the memory array 100 includes two-diode access devices operable to provide switching current to resistance-based memory elements.

The memory array 100 includes at least one memory cell 104. The memory array 100 may include a plurality of memory cells (e.g. memory cells 104 and 130-134). The memory array 100 depicted in FIG. 1 includes m rows and n columns of memory cells. In at least one embodiment, the memory array 100 is implemented as a magneto-resistive random access memory (MRAM) or as a spin torque transfer (SIT) MRAM.

A representative memory cell 104 may include a resistance-based memory element, e.g. resistance-based memory element 110. The resistance-based memory element 110 may be configured to store digital data. In at least one embodiment, the resistance-based memory element 110 is a magnetic tunnel junction (MTJ).

The memory cell 104 may be coupled to a word line 108, a sense line 112, and a bit line 114. The word line 108, the sense line 112, and the bit line 114 may be used to selectively control the resistance-based memory element 110. In a particular embodiment, the word line 108 is coupled to the resistance-based memory element 110 of memory cell 104.

The bit line 114 is coupled to a first diode 116 and the sense line 112 is coupled to a second diode 118. In a particular embodiment, a cathode 120 of the first diode 116 is coupled to the bit line 114, and an anode 122 of the second diode 118 is coupled to the sense line 112. The first diode 116 and the second diode 118 may each be coupled to the resistance-based memory element 110. The first diode 116 and the second diode 118 may form an access device that is operable to control electric currents and voltages introduced at the resistance-based memory element 110.

Typically, a diode conducts current in a forward direction when a threshold voltage is applied across the diode. For example, the second diode 118 may conduct current when a threshold voltage is applied across the second diode 118. In a particular embodiment, the sense line 112 is configured to apply a voltage at or above the threshold voltage to the anode 122 of the second diode 118.

In operation, the first diode 116 and the second diode 118 may selectively generate or oppose currents through the resistance-based memory element 110. For example, the first diode 116 and the second diode 118 may each control whether bias conditions at the word line 108, the sense line 112, and the bit line 114 create currents that flow through the resistance-based memory element 110.

The currents passed through the resistance-based memory element 110 may correspond to various operations, such as a logical zero write operation, a logical one write operation, and a read operation. The type of operation may depend on a direction and amplitude of a given current passed through the resistance-based memory element 110, a voltage applied to the resistance-based memory element 110, or any combination thereof. For example, to select the memory cell 104, bias voltages may be introduced at the word line 108, the sense line 112, and the bit line 114 that generate a current through the resistance-based memory element 110. For example, a read operation may be performed at the memory cell 104 by applying a high voltage to the word line 108, a low, zero, or ground voltage to the sense line 112, and a low, zero, or ground voltage to the bit line 114. Word lines, sense lines, and bit lines corresponding to unselected memory cells (e.g. the memory cells 130-134) may be biased with voltages that do not generate currents through the unselected memory cells.

It will be appreciated that the memory array 100 may offer improved control of selected memory cells (e.g. memory cell 104). For example, the cathode 120 of the first diode 116 may be selectively biased by the bit line 114. The anode 122 of the second diode 118 may be selectively biased by the sense line 112. Improved control of the memory array 100 may reduce costs associated with implementing drivers to control each memory cell (e.g. memory cell 104).

It will also be appreciated that the memory array 100 may facilitate reduced leakage current associated with unselected memory cells (e.g. the memory cells 130-134). For example, each unselected memory cell of FIG. 1 (e.g. memory cells 130-134) may be selectively controlled via its corresponding word line, sense line, and bit line. Therefore, each first diode and each second diode at each unselected memory cell (e.g. the memory cells 130-134) may be selectively biased to avoid passing a current through each corresponding resistance based memory element resulting in reduced leakage current through unselected memory cells.

It will further be appreciated that each memory cell of the memory array 100 may be of a small size. For example, the first diode 116 and the second diode 118 of the memory cell 104 may be coupled at only one point and to the resistance based memory element 110. In a particular embodiment, the cathode 120 of the first diode 116 is not coupled to the anode 122 of the second diode 118, and accordingly a terminal connection may be eliminated at each memory cell of the memory array 100. Therefore, the embodiment of the memory array 100 of FIG. 1 may include a compact distribution of memory cells and may therefore be of a small size.

Figure 2:
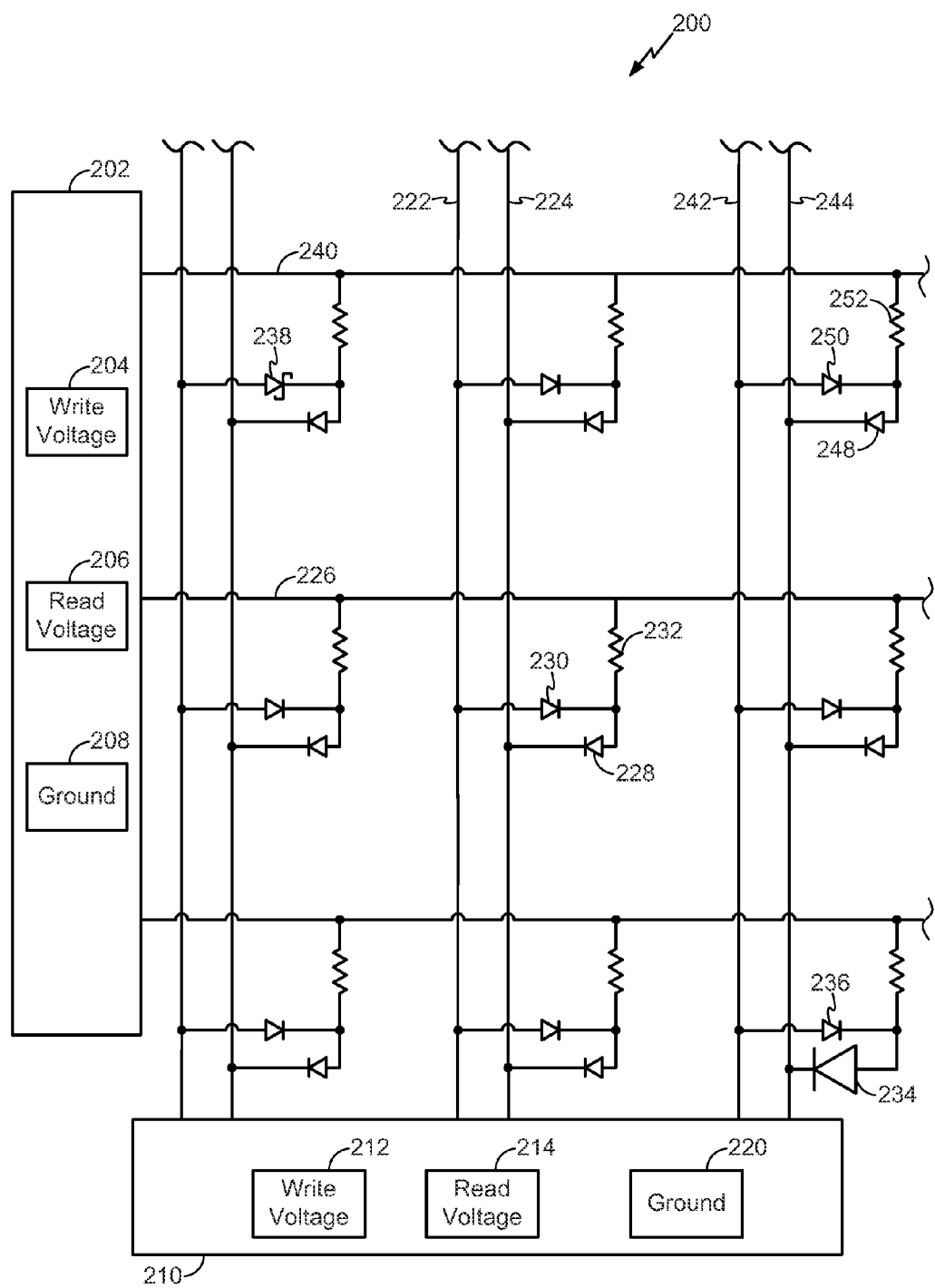
FIG. 2 is a circuit diagram of a particular illustrative embodiment of a circuit including memory cells that include a resistance-based memory having a two-diode access device.

Referring to FIG. 2, a particular illustrative embodiment of a circuit including a resistance-based memory having a two-diode access device is disclosed and generally designated 200. In a particular embodiment, the memory array 100 of FIG. 1 is implemented according to the circuit 200 of FIG. 2. The circuit 200 may facilitate switching between selected and unselected resistance-based memory cells. For ease of understanding, various components are designated as selected or unselected, although it should be appreciated that any component may be selected or unselected during operation of the circuit 200.

The circuit 200 may include a first driver 202 coupled to a plurality of word lines, including a selected word line 226 and an unselected word line 240. The first driver 202 may be configured to selectively bias the selected word line 226 and the unselected word line 240 with a voltage, such as a write voltage 204, a read voltage 206, or a ground 208. Each of the plurality of word lines may be coupled to a resistance-based memory element. For example, FIG. 2 depicts the selected word line 226 coupled to a selected resistance-based memory element 232 and the unselected word line 240 coupled to an unselected resistance-based memory element 252. The first driver 202 may be operable to apply a voltage to each resistance-based memory element. Alternatively, structural elements other than a driver may be used to provide the voltage.

The circuit 200 further may include a second driver 210 coupled to a plurality of sense lines and to a plurality of bit lines, including a selected bit line 224, a selected sense line 222, an unselected sense line 242, and an unselected bit line 244. The second driver 210 may be configured to selectively bias the selected bit line 224, the selected sense line 222, the unselected sense line 242, and the unselected bit line 244 with voltages, including a write voltage 212, a read voltage 214, or a ground 220. In a particular embodiment, the write voltage 212 is substantially similar or equal to the write voltage 204, the read voltage 214 is substantially similar or equal to the read voltage 206, and the ground 220 is substantially similar or equal to the ground 208. The second driver 210 may be operable to apply a voltage to each source line and to each bit line. Alternatively, structural elements other than a driver may be used to provide the voltage.

The plurality of bit lines may be coupled to a plurality of first diodes, e.g. a first diode 228 and a first diode 248. In a particular embodiment, the selected bit line 224 is coupled to a cathode of the first diode 228 and the unselected bit line 244 is coupled to a cathode of the first diode 248.

The plurality of sense lines may be coupled to a plurality of second diodes, e.g. a second diode 230 and a second diode 250. In a particular embodiment, the selected sense line 222 is coupled to an anode of the second diode 230 and the unselected sense line 242 is coupled to a cathode of the second diode 250.

Each first diode and each second diode may be coupled to a resistance-based memory element. For example, the first diode 228 and the second diode 230 may each be coupled to the selected resistance-based memory element 232. In a particular embodiment, an anode of the first diode 228 and a cathode of the second diode 230 may each be coupled to the selected resistance-based memory element 232. The first diode 228 and the second diode 230 may form a two-diode access device associated with the selected resistance-based memory element 232.

The circuit 200 may include diodes of various types. For example, any diode of the circuit 200 may be a p-n junction diode or a Schottky diode. In an illustrative, non-limiting embodiment, the circuit 200 includes p-n junction diodes 228, 230, 234, 236, 248, and 250, as well as Schottky diode 238.

The circuit 200 may include diodes of various sizes. For example, any two diodes of the circuit 200 may be of different sizes or of the same size. In an illustrative, non-limiting embodiment, the circuit 200 includes diodes 234, 236 of different sizes.

The circuit 200 may include diodes that are substantially similar. For example, the first diode 228 and the second diode 230 may be substantially similar in one or more of size, forward voltage drop, current density, or any combination thereof.

In operation, the first driver 202 may selectively apply the write voltage 204, the read voltage 206, or the ground 208 to any of the plurality of word lines. The second driver 210 may selectively apply the write voltage 212, the read voltage 214, or the ground 220 to any of the plurality of bit lines and to any of the plurality of sense lines.

For example, to write a data value to the selected resistance-based memory element 232, the first driver 202 may apply the write voltage 204 to the selected word line 226 and may apply the ground 208 to the unselected word line 240. The second driver 210 may apply the ground 220 to the selected bit line 224, to the selected sense line 222, and to the unselected sense line 242. The second driver 210 may apply the write voltage 212 to the unselected bit line 244, which may prevent or reduce current through unselected resistance based memory elements that are coupled to the selected word line 240.

Accordingly, a voltage difference (e.g. the difference of the write voltage 204 and the ground 220) may be applied across the selected resistance-based memory element 232 and the first diode 228, generating a current through the selected resistance-based memory element 232 and through the first diode 228. The second diode 230 may be biased to oppose the generated current through the selected resistance-based memory element 232, i.e. the second diode 230 may prevent the current from reaching the selected sense line 222. In a particular embodiment, no current is generated through unselected resistance-based memory element 252, since the unselected word line 240 and the unselected sense line 242 may each be biased with a zero voltage or ground. Further, the first diode 248 may oppose current from the unselected bit line 244 flowing through the unselected resistance-based memory element 252.

It will be appreciated that the circuit 200 may facilitate shielding of unselected resistance-based memory elements during operations of selected memory elements. For example, unselected resistance-based memory elements may be isolated by diodes from current used to read data from or write data to a selected memory element. In particular, bias conditions at a word line, a bit line, and a sense line corresponding to each resistance-based memory element may be maintained such that unselected resistance-based memory elements are not disturbed with currents applied to a selected memory cell. Accordingly, the circuit 200 of FIG. 2 may facilitate control and selective isolation of resistance-based memory elements and may reduce read disturbs and program disturbs of unselected resistance-based memory elements during operation of the circuit 200.

Figure 3:
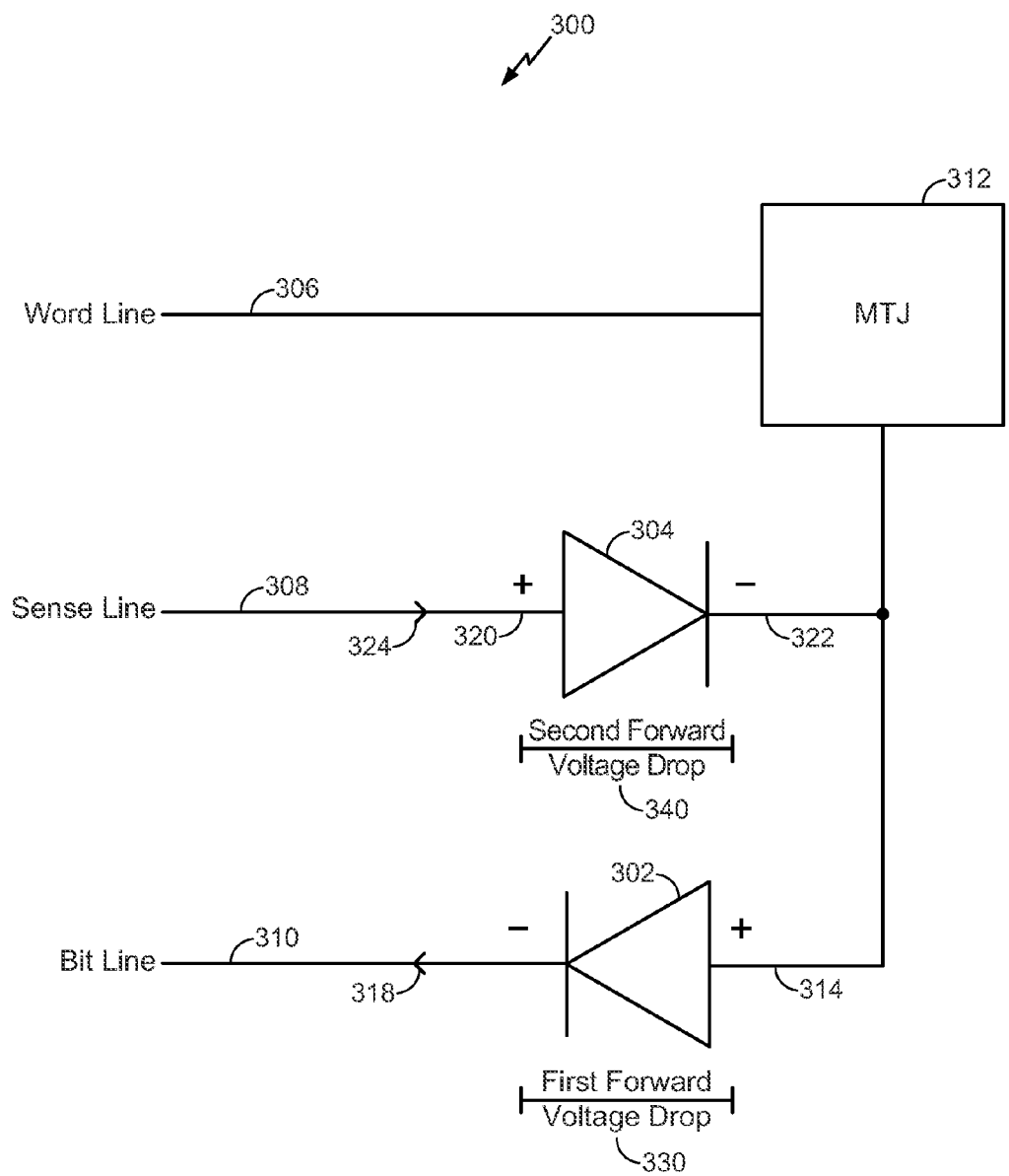
FIG. 3 is a diagram of a particular illustrative embodiment of a memory cell including a resistance-based memory having a two-diode access device.

Referring to FIG. 3, a particular illustrative embodiment of a memory cell having a two-diode access device is depicted and generally designated 300. In an illustrative embodiment, the memory cell 300 may be incorporated into the memory array 100 of FIG. 1, the circuit 200 of FIG. 2, or any combination thereof.

The memory cell 300 may include a magnetic tunnel junction (MTJ) device 312. The MTJ 312 may include a tunneling barrier, such as an MgO film, inserted between two magnetic layers, where one magnetic layer is a pinned layer with a fixed magnetization and the other layer is a free layer with a direction of magnetization that can change. Due to the tunnel magnetic resistance (TMR) effect, the resistance of the MTJ 312 changes corresponding to the relative alignment of magnetization of the two layers (i.e., a parallel state and an anti-parallel state). The resistance values of each of the two states may be used to correspond to data values (e.g., a logical zero and a logical one).

The MTJ 312 may be placed in the anti-parallel state when a current flowing through the MTJ 312 is increased above a threshold in an anti-parallelizing direction. In contrast, the MTJ 312 may be placed in a parallel state when the current is increased beyond a threshold in a parallelizing direction. A first switching current of the MTJ 312 may be a threshold current that switches the MTJ 312 from an anti-parallel state to a parallel state. A second critical switching current of the MTJ 312 may be a threshold current that switches the MTJ 312 from the parallel state to the anti-parallel state. The MTJ 312 may also be associated with a programming voltage, i.e. a voltage difference applied across the MTJ 312 sufficient to alter the state of the MTJ 312.

The MTJ 312 may be coupled to a word line 306. The MTJ 312 may also be coupled to a first diode 302 and to a second diode 304. In a particular embodiment, an anode 314 of the first diode 302 and a cathode 322 of the second diode 304 are each coupled to the MTJ 312 and to each other via a common node as shown. Thus, the anode 314 of the first diode 302 may be coupled to the cathode 322 of the second diode 304.

The memory cell 300 may include a bit line 310 and a sense line 308. In a particular embodiment, a cathode 316 of the first diode 302 is coupled to the bit line 310, and an anode 320 of the second diode 304 is coupled to the sense line 308. When the memory cell 300 is used in the memory array 200 of FIG. 2, the word line 306 may be selectively biased with the write voltage 204, the read voltage 206, or the ground 208 via the first driver 202 of FIG. 2. The sense line 308 and the bit line 310 may each be selectively biased, e.g. with the write voltage 212, the read voltage 214, or the ground 220 via the second driver 210 of FIG. 2.

The first diode 302 may be associated with a first forward voltage drop 330 when a first current 318 flows through the first diode 302. The second diode 304 may be associated with a second forward voltage drop 340 when a second current 324 flows through the second diode 304. The first forward voltage drop 330 may be a lowest voltage across the first diode 302 that allows the first diode 302 to be conductive, and the second forward voltage drop 340 may be the lowest voltage across the second diode 304 that allows the second diode 304 to be conductive.

In operation, the word line 306, the sense line 308, and the bit line 310 may be selectively biased to generate a first current 318 that flows through the first diode 302. In a particular embodiment, a high bias voltage at the word line 306 and low bias voltages at the sense line 308 and at the bit line 310 generate the first current 318 through the first diode 302. The second diode 304 may oppose the first current 318. The first current 318 may result in a write logical zero operation at the MTJ 312 or in a read operation at the MTJ 312. In a particular embodiment, the magnitude of the first current 318 determines the type of operation performed at the MTJ 312 (i.e. the write operation of the read operation).

Alternatively, the word line 306, the sense line 308, and the bit line 310 may be selectively biased to generate the second current 324 that flows through the second diode 304. In a particular embodiment, high bias voltages at the sense line 308 and at the bit line 310 and a low bias voltage at the word line 306 (e.g. ground) generate the second current 324 through the second diode 304. The high bias voltage at the bit line 310 may prevent the second current 324 from being applied to the bit line 310. The second current 324 may result in a write logical one operation at the MTJ 312.

In a particular embodiment, the first current 318 is generated in response to a voltage difference across the first diode 302 exceeding the first forward voltage drop 330 associated with the first diode 302. In a particular embodiment, the second current 324 is generated in response to a voltage difference across the second diode 304 exceeding the second forward voltage drop 340 associated with the second diode 304.

In a particular embodiment, the programming voltage associated with the MTJ 312 is approximately three times the first forward voltage drop 330, the second forward voltage drop 340, or any combination thereof. For example, the programming voltage associated with the MTJ 312 may be approximately 1.8 volts, the first forward voltage drop 330 may be approximately 0.6 volts, and the second forward voltage drop 340 may be approximately 0.6 volts. In another particular embodiment, the first diode 302 and the second diode 304 are each a Schottky diode and the programming voltage associated with the MTJ 312 is greater than three times the first forward voltage drop 330, the second forward voltage drop 340, or any combination thereof.

It will be appreciated that the memory cell 300 may be implemented without the use of a transistor and may facilitate high switching current at the MTJ 312 via reduction of a degeneration effect and may also facilitate a reduced-size access device. For example, a source degeneration effect that can occur due to a transistor access device driving a source line in a transistor-based memory cell may be avoided. A two-diode access device as in the memory cell 300 may avoid the transistor source degeneration effect, allowing high switching current at the MTJ 312 for a reduced-size access device.

It will also be appreciated that the first diode 302 and the second diode 304 may be chosen based on various criteria. For example, the first diode 302 and the second diode 304 may be chosen based on their associated current density or forward voltage drop characteristics. In a particular embodiment, the first diode 302 and the second diode 304 are selected to be matched to the MTJ 312. For example, a ratio of an area of the first diode 302 to an area of the second diode 304 may be approximately equal to a ratio of the first critical switching current of the MTJ 312 to the second critical switching current of the MTJ 312. Accordingly, if the first critical switching current and the second critical switching current of the MTJ 312 are of different magnitudes, the first diode 302 and the second diode 304 may be chosen to be asymmetric such that they balance switching characteristics of the MTJ 312.

Figure 4:
FIG. 4 is a state diagram of a particular illustrative embodiment of operating a resistance-based memory having a two-diode access device.

Referring to FIG. 4, a state diagram of a particular illustrative embodiment of operating a resistance-based memory having a two-diode access device is depicted and generally designated 400. The state diagram 400 may illustrate operation of a memory cell in the memory array 100 of FIG. 1, a memory cell in the circuit 200 of FIG. 2, the memory cell 300 of FIG. 3, or any combination thereof.

The state diagram 400 includes states corresponding to a write logical zero operation 402, a write logical one operation 404, and a read operation 406. The state diagram 400 depicts states corresponding to a selected word line, a selected sense line, a selected bit line, an unselected word line, an unselected sense line, and an unselected bit line. For example, the states may correspond to the selected word line 226, the selected sense line 222, the selected bit line 224, the unselected word line 240, the unselected sense line 242, and the unselected bit line 244 of FIG. 2.

In a particular illustrative embodiment, the state diagram 400 identifies bias voltages introduced by the first driver 202 at the selected word line 226 and at the unselected word line 240, e.g. any of the write voltage 204, the read voltage 206, and the ground 208 of FIG. 2. The state diagram 400 may also identify bias voltages introduced by the second driver 210 at the selected bit line 224, the selected sense line 222, the unselected bit line 244, and the unselected sense line 242, e.g. any of the write voltage 212, the read voltage 214, and the ground 220 of FIG. 2.

The state diagram 400 depicts states that may result in the write logical zero operation 402. In a particular embodiment, the write logical zero operation 402 is performed on the selected resistance-based memory element 232 of FIG. 2 by applying a write voltage to the selected word line 226 and to the unselected bit line 244. The selected sense line 222, the selected bit line 224, the unselected word line 240, and the unselected sense line 242 may be biased with a zero voltage or ground.

The state diagram 400 also depicts states that may result in the write logical one operation 404. In a particular embodiment, the write logical one operation 404 is performed on the selected resistance-based memory element 232 of FIG. 2 by applying a write voltage to the selected sense line 222, to the selected bit line 224, to the unselected word line 240, and to the unselected bit line 244. The selected word line 226 and the unselected sense line 242 may be biased with a zero voltage or ground.

The state diagram 400 further depicts states that may result in the read operation 406. In a particular embodiment, the read operation 406 is performed on the selected resistance-based memory element 232 of FIG. 2 by applying a read voltage to the selected word line 226 and to the unselected bit line 244. The selected sense line 222, the selected bit line 224, the unselected word line 240, and the unselected sense line 242 may be biased with a zero voltage or ground. In a particular embodiment, the zero voltage or the ground is replaced by a different voltage level that is not maintained at zero volts.

For example, in a particular implementation, the zero voltage or the ground may be replaced by a non-zero magnitude voltage level.

It will be appreciated that the memory array 100 of FIG. 1, the circuit 200 of FIG. 2, the memory cell 300 of FIG. 3, and the state diagram 400 of FIG. 4 in conjunction illustrate functionality for accepting a current from a word line through a resistance-based memory element. For example, a diode or any equivalent structure, such as a p-n junction, may provide a means for accepting the current from the word line through the resistance-based memory element. A diode or any equivalent structure, such as a p-n junction, may also be used to provide a means for accepting a current from the sense line through the resistance-based memory element and for opposing the current from the word line through the resistance-based memory element.

Figure 5:
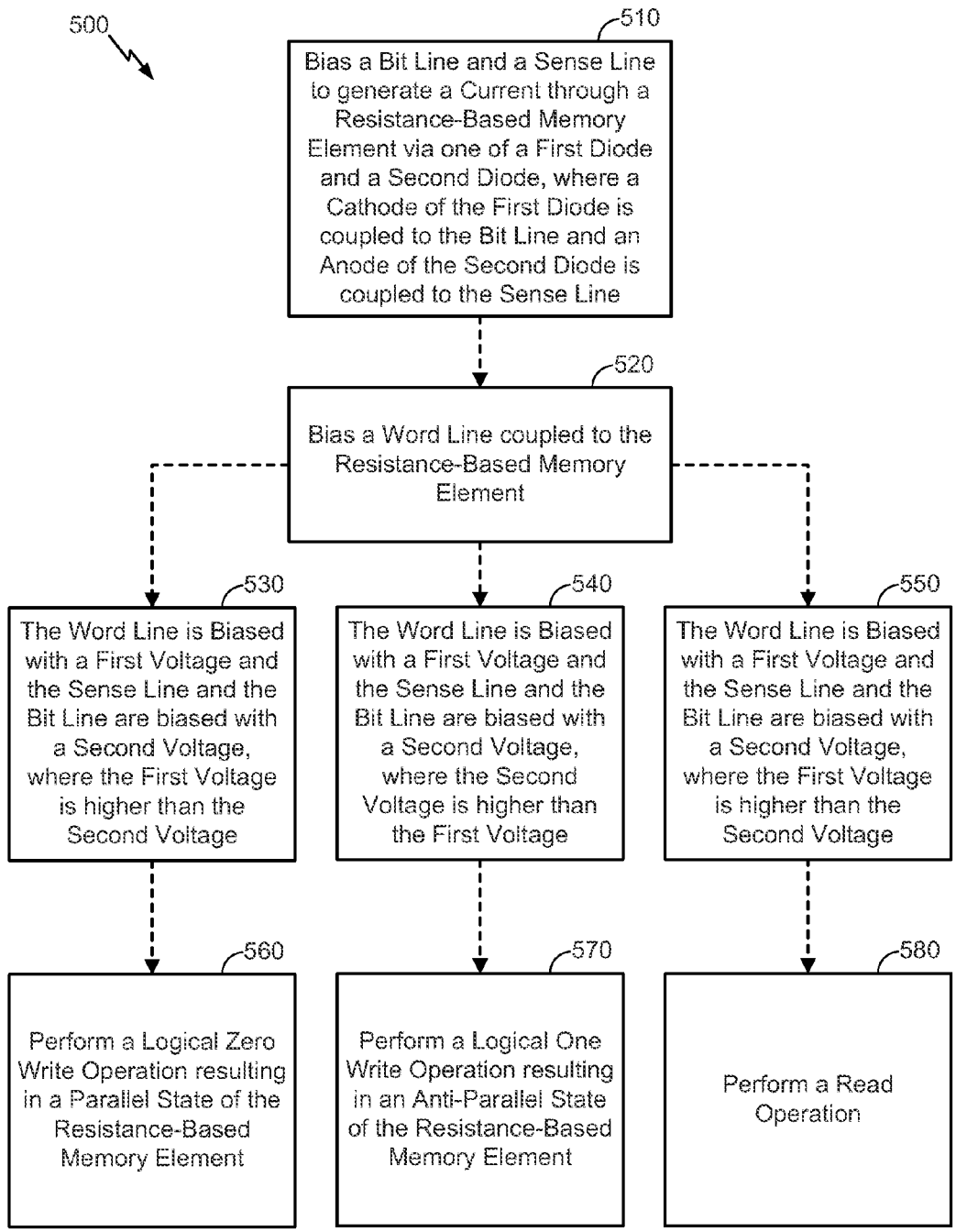
FIG. 5 is a flow diagram of a particular illustrative embodiment of a method of operating a resistance-based memory having a two-diode access device.

Referring to FIG. 5, a particular illustrative embodiment of a method of reading and writing data to a resistance-based memory having a two-diode access device is depicted and generally designated 500. The method 500 may be performed at the memory array 100 of FIG. 1, the circuit 200 of FIG. 2, the memory cell 300 of FIG. 3, or any combination thereof.

The method 500 includes biasing a bit line and a sense line to generate a current through a resistance-based memory element via a first diode or a second diode, where a cathode of the first diode is coupled to the bit line and an anode of the second diode is coupled to the sense line, as shown at 510. In a particular embodiment, a second driver biases the bit line and the sense line by applying a write voltage, a read voltage, or a ground. For example, the second driver 210 of FIG. 2 may bias the selected bit line 224 and the selected sense line 222 with the write voltage 212, the read voltage 214, or the ground 220.

Continuing to 520, the method 500 includes biasing a word line coupled to the resistance-based memory element. In a particular embodiment, a first driver biases the word line by applying a write voltage, a read voltage, or a ground. For example, the first driver 202 of FIG. 2 may bias the selected word line 226 with the write voltage 204, the read voltage 206, or the ground 208.

A generated current through the resistance-based memory element may correspond to a logical zero write operation, at 560, a logical one write operation, at 570, or a read operation, at 580. In a particular embodiment, a direction and magnitude of the current determines the type of operation performed, i.e. the logical zero write operation, at 560, the logical one write operation, at 570, or the read operation, at 580.

In a particular embodiment, for a logical zero operation, the word line is biased with a first voltage and the bit line and the sense line are biased with a second voltage, where the first voltage is higher than the second voltage, at 530. For example, the first voltage may be the write voltage 204 of FIG. 2 and the second voltage may be the ground 220 of FIG. 2. In this case, the generated current may correspond to a logical zero write operation and may result in a parallel state of the resistance-based memory element, at 560. In a particular embodiment, the first driver 202 of FIG. 2 may apply the first voltage to the selected word line 226, and the second driver 210 may apply the second voltage to the selected bit line 224 and to the selected sense line 222 to generate a parallel state at the selected resistance-based memory element 232.

Alternatively, for the logical one write operation, the word line may be biased with a first voltage and the sense line and the bit line may be biased with a second voltage, where the second voltage is higher than the first voltage, at 540. For example, the first voltage may be the ground 208 of FIG. 2 and the second voltage may be the write voltage 212 of FIG. 2. In this case, the generated current may correspond to a logical one write operation and may result in an anti-parallel state of the resistance-based memory element, at 570. In a particular embodiment, the first driver 202 of FIG. 2 may apply the first voltage to the selected word line 226, and the second driver 210 may apply the second voltage to the selected bit line 224 and to the selected sense line 222 to generate an anti-parallel state at the selected resistance-based memory element 232.

For the read operation, the word line may be biased with a first voltage and the sense line and the bit line may be biased with a second voltage, where the first voltage is higher than the second voltage. For example, the first voltage may be the read voltage 206 of FIG. 2 and the second voltage may be the ground 220 of FIG. 2. In this case, the generated current may correspond to a read operation, at 580. In a particular embodiment, the first driver 202 of FIG. 2 may apply the first voltage to the selected word line 226, and the second driver 210 may apply the second voltage to the selected bit line 224 and to the selected sense line 222 to read a state of the selected resistance-based memory element 232.

During the read operation, the state of a resistance-based memory element, e.g. the MTJ 312 of FIG. 3, may be determined based on a read current flowing through the resistance-based memory element. The read current may be large enough to determine the resistive state of the resistance-based memory element but small enough to not cause the resistance-based memory element to change states (i.e. between parallel and anti-parallel states). For example, in a particular embodiment the first voltage (e.g. the write voltage 204 of FIG. 2) at 530 is greater than the first voltage (e.g. the read voltage 206 of FIG. 2) at 550.

Figure 6:
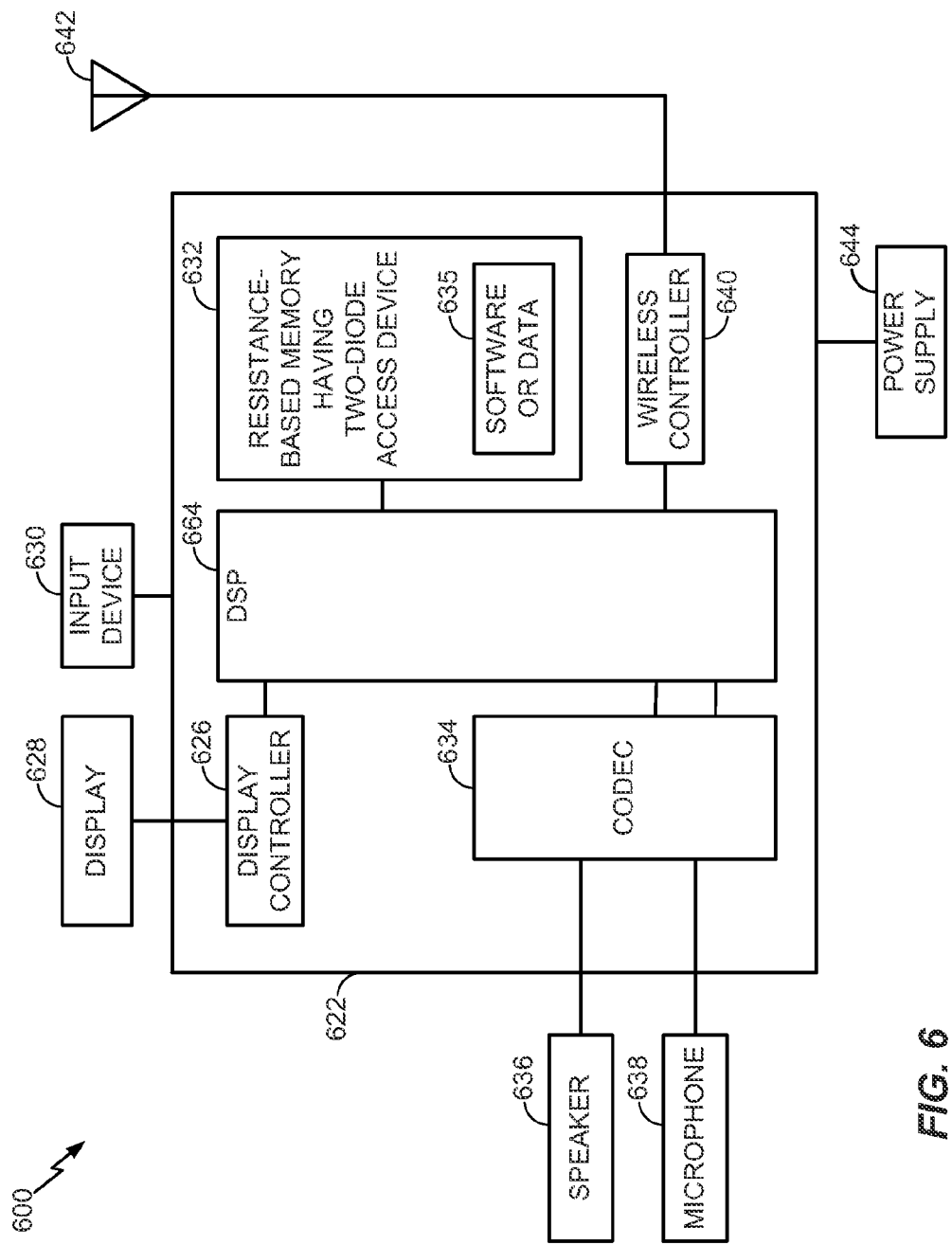
FIG. 6 is a block diagram of a particular illustrative embodiment of a portable device including a resistance-based memory having a two-diode access device.

Referring to FIG. 6, a block diagram of a particular illustrative embodiment of an electronic device including a resistance-based memory having a two-diode access device is depicted and generally designated 600. The device 600 includes a processor, such as a digital signal processor (DSP) 664, coupled to a resistance-based memory having a two-diode access device 632. The memory 632 may store software or data 635. In an illustrative example, the device 600 including a resistance-based memory having a two-diode access device 600 includes the memory array 100 depicted in FIG. 1, the circuit 200 of FIG. 2, and the memory cell 300 of FIG. 3, and is operated in accordance with one or more of the state diagram 400 of FIG. 4, the method 500 of FIG. 5, or any combination thereof.

FIG. 6 also shows a display controller 626 that is coupled to the digital signal processor 664 and to a display 628. A coder/decoder (CODEC) 634 can also be coupled to the digital signal processor 664. A speaker 636 and a microphone 638 can be coupled to the CODEC 634.

FIG. 6 also indicates that a wireless controller 640 can be coupled to the digital signal processor 664 and to a wireless antenna 642. In a particular embodiment, the DSP 664, the display controller 626, the resistance-based memory having a two-diode access device 632, the CODEC 634, and the wireless controller 640 are included in a system-in-package or system-on-chip device 622. In a particular embodiment, an input device 630 and a power supply 644 are coupled to the system-on-chip device 622. Moreover, in a particular embodiment, as illustrated in FIG. 6, the display 628, the input device 630, the speaker 636, the microphone 638, the wireless antenna 642, and the power supply 644 are external to the system-on-chip device 622. However, each of the display 628, the input device 630, the speaker 636, the microphone 638, the wireless antenna 642, and the power supply 644 can be coupled to a component of the system-on-chip device 622, such as an interface or a controller.

Figure 7:
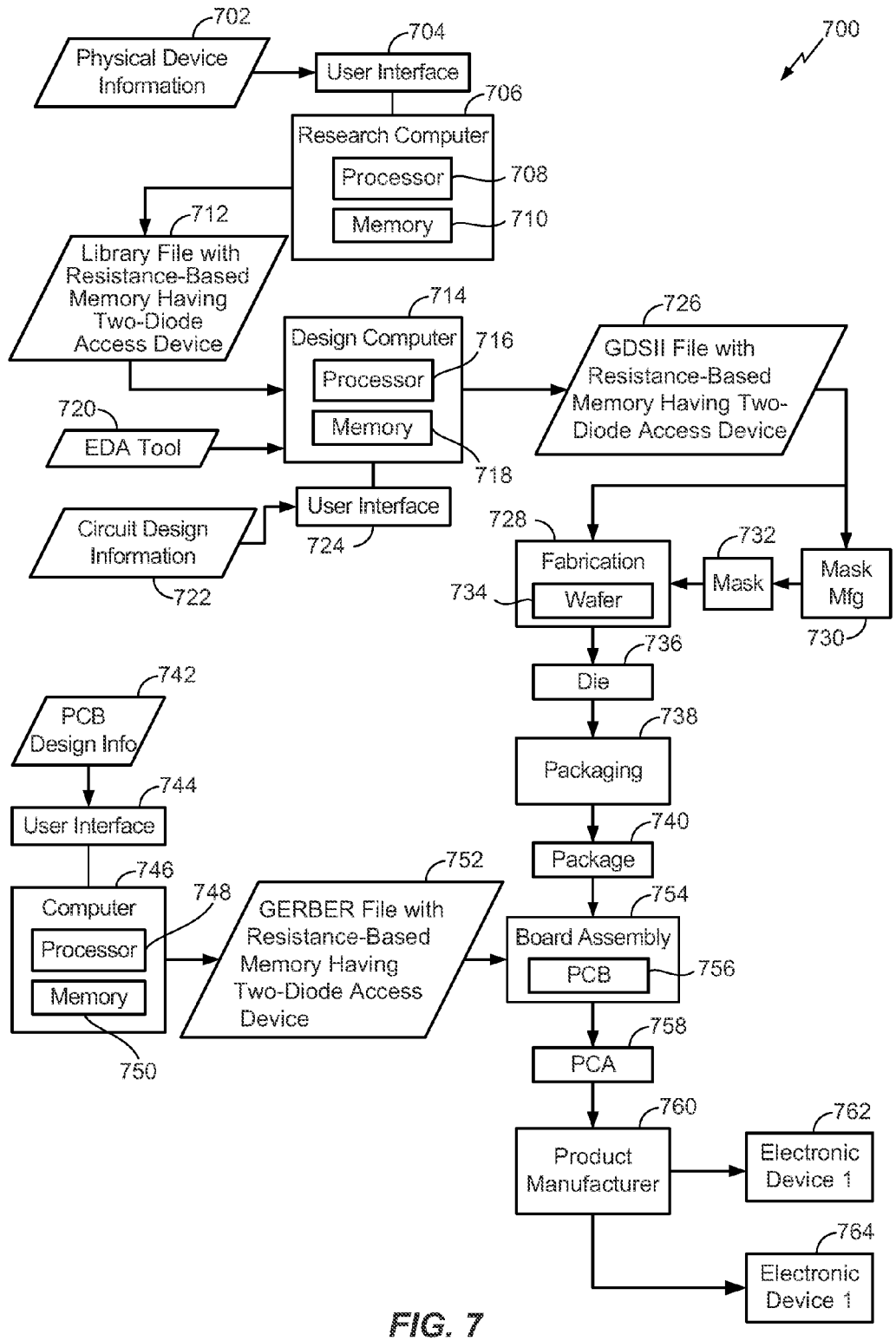
FIG. 7 is a data flow diagram of a particular illustrative embodiment of a manufacturing process to manufacture electronic devices that include a resistance-based memory having a two-diode access device.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 7 depicts a particular illustrative embodiment of an electronic device manufacturing process 700.

Physical device information 702 is received in the manufacturing process 700, such as at a research computer 706. The physical device information 702 may include design information representing at least one physical property of a semiconductor device, such as the memory array 100 of FIG. 1, the circuit 200 of FIG. 2, the memory cell 300 of FIG. 3, or any combination thereof. For example the physical device information 702 may include physical parameters, material characteristics, and structure information that is entered via a user interface 704 coupled to the research computer 706. The research computer 706 includes a processor 708, such as one or more processing cores, coupled to a computer readable medium, such as a memory 710. The memory 710 may store computer readable instructions that are executable to cause the processor 708 to transform the physical device information 702 to comply with a file format and to generate a library file 712.

In a particular embodiment, the library file 712 includes at least one data file including transformed design information. For example, the library file 712 may include a library of semiconductor devices including the memory array 100 of FIG. 1, the circuit 200 of FIG. 2, the memory cell 300 of FIG. 3, or any combination thereof, that is provided for use with an electronic design automation (EDA) tool 720.

The library file 712 may be used in conjunction with the EDA tool 720 at a design computer 714 including a processor 716, such as one or more processing cores, coupled to a memory 718. The EDA tool 720 may be stored as processor executable instructions at the memory 718 to enable a user of the design computer 714 to design a circuit using the memory array 100 of FIG. 1, the circuit 200 of FIG. 2, the memory cell 300 of FIG. 3, or any combination thereof, of the library file 712. For example, a user of the design computer 714 may enter circuit design information 722 via a user interface 724 coupled to the design computer 714. The circuit design information 722 may include design information representing at least one physical property of a semiconductor device, such as the memory array 100 of FIG. 1, the circuit 200 of FIG. 2, the memory cell 300 of FIG. 3, or any combination thereof. To illustrate, the circuit design information may include identification of particular circuits and relationships to other elements in a circuit design, positioning information, feature size information, interconnection information, or other information representing a physical property of a semiconductor device.

The design computer 714 may be configured to transform the design information, including the circuit design information 722 to comply with a file format. To illustrate, file formation may include a database binary file format representing planar geometric shapes, text labels, and other information about a circuit layout in a hierarchical format, such as a Graphic Data System (GDSII) file format. The design computer 714 may be configured to generate a data file including the transformed design information, such as a GDSII file 726 that includes information describing the memory array 100 of FIG. 1, the circuit 200 of FIG. 2, the memory cell 300 of FIG. 3, or any combination thereof, in addition to other circuits or information. To illustrate, the data file may include information corresponding to a system-on-chip (SOC) that includes the memory array 100 of FIG. 1 and that also includes additional electronic circuits and components within the SOC.

The GDSII file 726 may be received at a fabrication process 728 to manufacture the memory array 100 of FIG. 1, the circuit 200 of FIG. 2, the memory cell 300 of FIG. 3, or any combination thereof, according to transformed information in the GDSII file 726. For example, a device manufacture process may include providing the GDSII file 726 to a mask manufacturer 730 to create one or more masks, such as masks to be used for photolithography processing, illustrated as a representative mask 732. The mask 732 may be used during the fabrication process to generate one or more wafers 734, which may be tested and separated into dies, such as a representative die 736. The die 736 includes a circuit including the memory array 100 of FIG. 1, the circuit 200 of FIG. 2, the memory cell 300 of FIG. 3, or any combination thereof.

The die 736 may be provided to a packaging process 738 where the die 736 is incorporated into a representative package 740. For example, the package 740 may include the single die 736 or multiple dies, such as a system-in-package (SiP) arrangement. The package 740 may be configured to conform to one or more standards or specifications, such as Joint Electron Device Engineering Council (JEDEC) standards.

Information regarding the package 740 may be distributed to various product designers, such as via a component library stored at a computer 746. The computer 746 may include a processor 748, such as one or more processing cores, coupled to a memory 710. A printed circuit board (PCB) tool may be stored as processor executable instructions at the memory 750 to process PCB design information 742 received from a user of the computer 746 via a user interface 744. The PCB design information 742 may include physical positioning information of a packaged semiconductor device on a circuit board, the packaged semiconductor device corresponding to the package 740 including the memory array 100 of FIG. 1, the circuit 200 of FIG. 2, the memory cell 300 of FIG. 3, or any combination thereof.

The computer 746 may be configured to transform the PCB design information 742 to generate a data file, such as a GERBER file 752 with data that includes physical positioning information of a packaged semiconductor device on a circuit board, as well as layout of electrical connections such as traces and vias, where the packaged semiconductor device corresponds to the package 740 including the memory array 100 of FIG. 1, the circuit 200 of FIG. 2, the memory cell 300 of FIG. 3, or any combination thereof In other embodiments, the data file generated by the transformed PCB design information may have a format other than a GERBER format.

The GERBER file 752 may be received at a board assembly process 754 and used to create PCBs, such as a representative PCB 756, manufactured in accordance with the design information stored within the GERBER file 752. For example, the GERBER file 752 may be uploaded to one or more machines for performing various steps of a PCB production process. The PCB 756 may be populated with electronic components including the package 740 to form a represented printed circuit assembly (PCA) 758.

The PCA 758 may be received at a product manufacture process 760 and integrated into one or more electronic devices, such as a first representative electronic device 762 and a second representative electronic device 764. As an illustrative, non-limiting example, the first representative electronic device 762, the second representative electronic device 764, or both, may be selected from the group of a set top box, a music player, a video player, an entertainment unit, a navigation device, a communications device, a personal digital assistant (PDA), a fixed location data unit, and a computer. As another illustrative, non-limiting example, one or more of the electronic devices 762 and 764 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Embodiments of the disclosure may be suitably employed in any device that includes active integrated circuitry including memory and on-chip circuitry.

Thus, the memory array 100 of FIG. 1, the circuit 200 of FIG. 2, the memory cell 300 of FIG. 3, or any combination thereof, may be fabricated, processed, and incorporated into an electronic device, as described in the illustrative process 700. One or more aspects of the embodiments disclosed with respect to FIGS. 1-5 may be included at various processing stages, such as within the library file 712, the GDSII file 726, and the GERBER file 752, as well as stored at the memory 710 of the research computer 706, the memory 718 of the design computer 714, the memory 750 of the computer 746, the memory of one or more other computers or processors (not shown) used at the various stages, such as at the board assembly process 754, and also incorporated into one or more other physical embodiments such as the mask 732, the die 736, the package 740, the PCA 758, other products such as prototype circuits or devices (not shown), or any combination thereof. Although various representative stages of production from a physical device design to a final product are depicted, in other embodiments fewer stages may be used or additional stages may be included. Similarly, the process 700 may be performed by a single entity, or by one or more entities performing various stages of the process 700.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), magneto-resistive random access memory (MRAM), spin torque transfer (STT) MRAM, flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

In a particular embodiment, the storage medium stores instructions that are executable by a computer to bias a bit line and a sense line to generate a current through a resistance-based memory element via a first diode or a second diode, where a cathode of the first diode is coupled to the bit line and an anode of the second diode is coupled to the sense line. The instructions may be further executable by the computer to bias a word line coupled to the resistance-based memory element. The instructions may also be executable by the computer to control a first driver coupled to the word line.

In a particular embodiment, the instructions are further executable by the computer to control a second driver coupled to the bit line and to the sense line. The instructions may be further executable by the computer to write a data value to the resistance-based memory element. The instructions may also be executable by the computer to read a data value associated with the resistance-based memory element. For example, the instructions may be executed at a memory controller, processor, or other computing device configured to read data from or write data to a memory, such as a resistance-based memory having a two-diode access device.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A memory device comprising:
    a memory cell comprising:
        a resistance-based memory element;
        a first diode coupled to the resistance-based memory element; and
        a second diode coupled to the resistance-based memory element,
        wherein a ratio of an area of the first diode to an area of the second diode is approximately equal to a ratio of a first critical switching current of the resistance-based memory element to a second critical switching current of the resistance-based memory element,
        wherein a current through the resistance-based memory element flows through the first diode or the second diode, and
        wherein a cathode of the first diode is coupled to a bit line of the memory cell and an anode of the second diode is coupled to a sense line of the memory cell.

2. The memory device of claim 1, wherein an anode of the first diode is coupled to a cathode of the second diode.

3. The memory device of claim 2, wherein the anode of the first diode and the cathode of the second diode are each coupled to the resistance-based memory element.

4. The memory device of claim 1, further comprising a first driver coupled to the resistance-based memory element and a second driver coupled to the bit line and to the sense line.

5. The memory device of claim 1, wherein a programming voltage of the resistance-based memory element is configured to be more than three times greater than a forward voltage drop associated with the first diode.

6. The memory device of claim 5, wherein the forward voltage drop is based on a lowest voltage across the first diode that enables the first diode to be conductive.

7. The memory device of claim 1, further comprising an array of memory cells that includes the memory cell.

8. The memory device of claim 1, wherein the resistance-based memory element includes a magnetic tunnel junction (MTJ).

9. The memory device of claim 8, wherein the first critical switching current corresponds to a first threshold current that switches the MTJ from an anti-parallel state to a parallel state, and wherein the second critical switching current corresponds to a second threshold current that switches the MTJ from the parallel state to the anti-parallel state.

10. The memory device of claim 1, wherein at least one of the first diode and the second diode is a p-n junction diode.

11. The memory device of claim 1, wherein at least one of the first diode and the second diode is a Schottky diode.

12. The memory device of claim 1, wherein the first diode and the second diode are substantially similar in one or more of size, forward voltage drop, and current density.

13. The memory device of claim 1, wherein the memory cell is integrated in at least one semiconductor die.

14. The memory device of claim 1, further comprising at least one of: a set top box, a music player, a video player, an entertainment unit, a navigation device, a communications device, a personal digital assistant (PDA), a fixed location data unit, or a computer, into which the memory cell is integrated.

* * * * *